(12) United States Patent
Wang et al.

(10) Patent No.: US 9,915,780 B2
(45) Date of Patent: Mar. 13, 2018

(54) OPTICAL MODULE WITH A DUAL LAYER PCBA STRUCTURE

(71) Applicant: InnoLight Technology (Suzhou) LTD., Suzhou, Jiangsu (CN)

(72) Inventors: Zhanwei Wang, Jiangsu (CN); Kewu Wang, Jiangsu (CN)

(73) Assignee: InnoLight Technology (Suzhou) LTD., Suzhou (CN)

( * ) Notice: Subject to any disclaimer, the term of this patent is extended or adjusted under 35 U.S.C. 154(b) by 0 days.

(21) Appl. No.: 15/627,838

(22) Filed: Jun. 20, 2017

(65) Prior Publication Data

US 2017/0363807 A1 Dec. 21, 2017

(30) Foreign Application Priority Data

Jun. 21, 2016 (CN) .......................... 2016 1 0452531

(51) Int. Cl.

| | |
|---|---|
| *G02B 6/36* | (2006.01) |
| *G02B 6/122* | (2006.01) |
| *G02B 6/42* | (2006.01) |
| *H05K 1/18* | (2006.01) |
| *H04J 3/16* | (2006.01) |
| *H04L 29/06* | (2006.01) |
| *H05K 1/03* | (2006.01) |

(52) U.S. Cl.
CPC .......... *G02B 6/122* (2013.01); *G02B 6/4274* (2013.01); *G02B 6/4281* (2013.01); *G02B 6/4283* (2013.01); *H04J 3/1611* (2013.01); *H04L 69/12* (2013.01); *H05K 1/03* (2013.01); *H05K 1/18* (2013.01)

(58) Field of Classification Search
CPC .... G02B 6/122; G02B 6/4283; G02B 6/4281; G02B 6/4274; H05K 1/03; H05K 1/18; H04L 69/12; H04J 3/1611
See application file for complete search history.

(56) References Cited

U.S. PATENT DOCUMENTS 6,665,184 B2 * 12/2003 Akselband ................ F28F 3/12
165/104.33
9,594,995 B1 * 3/2017 Lin .................. G06K 19/06206
(Continued)

FOREIGN PATENT DOCUMENTS

CN 104684245 A 6/2015

*Primary Examiner* — Ellen Kim
(74) *Attorney, Agent, or Firm* — Finnegan, Henderson, Farabow, Garrett & Dunner, LLP

(57) ABSTRACT

An optical module with a dual layer printed circuit board assembly (PCBA) structure. The optical module includes a first casing and a second casing, and a first PCBA board and a second PCBA board located between the first casing and the second casing, a plurality of power components arranged on opposing surfaces of at least one of the first PCBA board and the second PCBA board, a layer of thermal superconducting medium of a bent arrangement including a first thermal conducting part and a second thermal conducting part arranged opposite to each other, the first thermal conducting part being thermally connected to the power component, and the second thermal conducting part being thermally connected to at least one of the first casing and the second casing, and at least one insulating layer arranged between the layer of thermal superconducting medium and the power components.

11 Claims, 4 Drawing Sheets

(56) References Cited

U.S. PATENT DOCUMENTS

| | | | |
|---|---|---|---|
| 9,690,032 B1* | 6/2017 | Nichol | G02B 6/0035 |
| 2014/0049983 A1* | 2/2014 | Nichol | G02B 6/0018 |
| | | | 362/610 |

* cited by examiner

OPTICAL MODULE WITH A DUAL LAYER PCBA STRUCTURE

CROSS-REFERENCE TO RELATED APPLICATIONS

This application is based upon and claims the benefit of priority from prior Chinese Patent Application No. 201610452531.3 filed on Jun. 21, 2016, the entire contents of which are incorporated herein by reference.

FIELD OF THE DISCLOSURE

The present application belongs to the technical field of optical communication and specifically relates to an optical module with a dual layer printed circuit board assembly (PCBA) structure.

BACKGROUND

An optical module consists of a photoelectric component, a functional circuit, and an optical interface. The photoelectric component includes a transmitting part and a receiving part. The primary function of an optical module is photoelectric conversion. Electrical signals are converted into optical signals at a transmitting terminal. The optical signals are transmitted through optical fibers and then converted into electrical signals at a receiving terminal, thereby enabling the transmission of information.

The current trend of optical module design involves designing optical modules that have increasingly smaller packaging volumes and increasingly higher data transfer rates. In addition, a high-power chip can be included in the optical module. The high-power chip consumes a large amount of power during normal operation and generates high temperatures in local regions. If the heat cannot be effectively dissipated through a casing of the optical module, the chip's performance will be impacted and the power consumption of the optical module as a whole will increase significantly, which may result in the failure of temperature-sensitive components. Therefore, a heat dissipating structure of an optical module will be particularly important.

Consequently, in order to address the aforementioned problems, it is necessary to provide an optical module with a dual layer printed circuit board assembly (PCBA) structure.

SUMMARY

Consistent with one embodiment of the present application, there is provided an optical module with a dual layer printed circuit board assembly (PCBA) structure. The optical module includes a first casing and a second casing, and a first PCBA board and a second PCBA board located between the first casing and the second casing, a plurality of power components arranged on opposing surfaces of at least one of the first PCBA board and second PCBA board, a layer of thermal superconducting medium of a bent arrangement including a first thermal conducting part and a second thermal conducting part arranged opposite to each other, the first thermal conducting part being thermally connected to the power components, and the second thermal conducting part being thermally connected to at least one of the first casing and the second casing, and at least one insulating layer arranged between the layer of thermal superconducting medium and the power components. Heat generated by the power components is transferred through the at least one insulating layer to the layer of thermal superconducting medium where the heat is diffused horizontally and transferred to at least one of the first casing and the second casing.

DETAILED DESCRIPTION

Reference will now be made in detail to the present embodiments, examples of which are illustrated in the accompanying drawings. Wherever possible, the same reference numbers will be used throughout the drawings to refer to the same or like parts.

The text below provides a detailed description of the present application through referencing embodiments as shown in the attached drawings. However, these embodiments do not limit the application; the scope of protection for the present application covers changes made to the structure, method, or function by persons of ordinary skill in the art based on the embodiments.

In order to facilitate the presentation of the figures in the present application, the sizes of certain structures or parts have been enlarged relative to other structures or parts; as such, they are only for the purpose of illustrating the basic structure of the subject matter of the present application.

Terms in the text indicating relative spatial position, such as "upper," "above," "lower," "below," and so forth, are used for explanatory purposes in describing the relationship between a unit or feature depicted in a drawing with another unit or feature therein. Terms indicating relative spatial position can refer to positions other than those depicted in the figures when a device is being used or operated. For example, if the device shown in a figure is flipped over, a unit which is described as being located "below" or "under" another unit or feature will be located "above" the other unit or feature. Therefore, the exemplary term "below" can include positions both above and below. A device can be oriented in other ways (rotated 90 degrees or facing another direction); as such, descriptive spatially-related terms that appear in the text should be interpreted accordingly.

When an element or layer is said to be "above" another part or layer or "connected to" another part or layer, it may be directly above the other part or layer or directly connected to the other part or layer, or there may be an intermediate element(s) or layer(s). Conversely, when a part is said to be "directly above another part or layer" or "directly connected to another part or layer," there cannot be any intermediate parts or layers.

Figure 1:
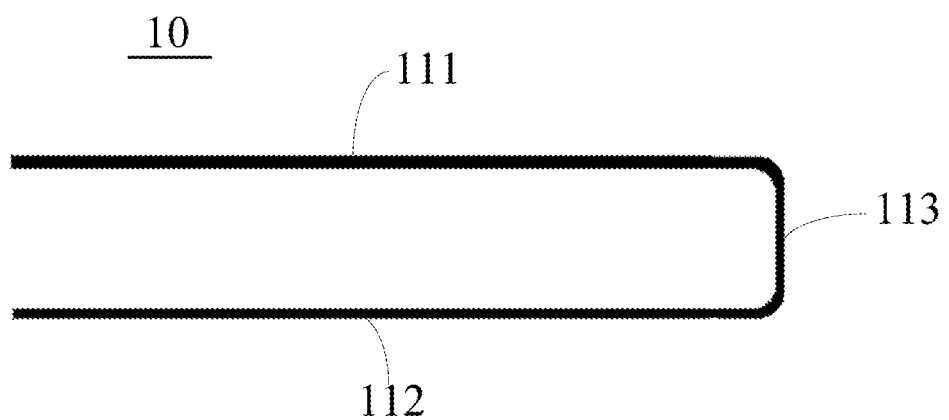
FIG. 1 is a schematic diagram showing a heat dissipating structure according to a first embodiment of the present application.

FIG. 1 is a schematic diagram showing a heat dissipating structure 10 according to a first embodiment of the present application. The heat dissipating structure 10 is a layer of thermal superconducting medium in a bendable arrangement. The layer of thermal superconducting medium includes a first thermal conducting part 111 and a second thermal conducting part 112 arranged opposite to each other, and a third thermal conducting part 113 connecting the first thermal conducting part 111 and the second thermal conducting part 112. When the heat dissipating structure is used to dissipate heat on an optical module, heat is transferred between the first thermal conducting part 111, the third thermal conducting part 113, and the second thermal conducting part 112.

In the present embodiment illustrated in FIG. 1, the first thermal conducting part 111 and the second thermal conducting part 112 are arranged opposite to each other in parallel, and the third thermal conducting part 113 is arranged perpendicular to one end of the first thermal conducting part 111 and one end of the second thermal conducting part 112, respectively.

The layer of thermal superconducting medium may be made of graphene, copper foil, or aluminum foil, etc. As used herein, the "thermal superconducting medium" refers to a medium made of materials having a thermal conductivity coefficient of greater than 400 W/(m·K). The layer of thermal superconducting medium has a high pliability. The first thermal conducting part 111, the second thermal conducting part 112, and the third thermal conducting part 113 in the present embodiment are formed by bending the layer of thermal superconducting medium at angles that are set for different optical modules.

The layer of thermal superconducting medium has a good planar heat diffusion property. When heat is transferred to the layer of thermal superconducting medium, the planar heat diffusion property of the thermal superconducting material allows the heat to be diffused on one surface of the layer of thermal superconducting medium and then continue to be transferred through the other surface. The layer of thermal superconducting medium selected for the present embodiment has a planar thermal conductivity coefficient of 400-2000 W/(m·K) and a vertical thermal conductivity coefficient of 10-20 W/(m·K).

Figure 2:
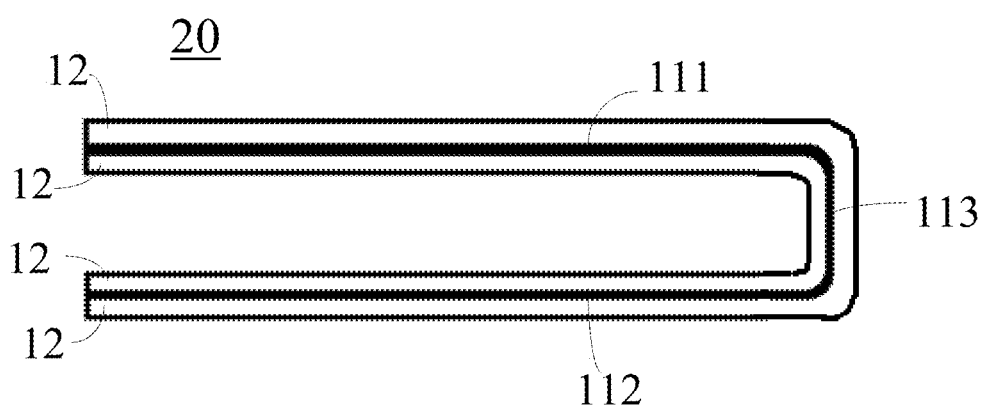
FIG. 2 is a schematic diagram showing a heat dissipating structure according to a second embodiment of the present application.

FIG. 2 is a schematic diagram showing a heat dissipating structure 20 according to a second embodiment of the present application. Similar to the heat dissipating structure 10 of the first embodiment, the heat dissipating structure 20 includes a layer of thermal superconducting medium. The layer of thermal superconducting medium includes the first thermal conducting part 111 and the second thermal conducting part 112 arranged opposite to each other, and the third thermal conducting part 113 connecting the first thermal conducting part 111 and the second thermal conducting part 112. Unlike the heat dissipating structure 10 of the first embodiment, in the heat dissipating structure 20 of the second embodiment, an insulating layer is arranged on at least one side of the first thermal conducting part 111, the second thermal conducting part 112, and the third thermal conducting part 113 to achieve the functions of electrical insulation, thermal conduction, and so forth.

In the embodiment as shown in FIG. 2, the insulating layer 12 is arranged on each of the two sides of the first thermal conducting part 111, the second thermal conducting part 112, and the third thermal conducting part 113, thereby simultaneously achieving the functions of thermal conduction and electrical insulation. Since the layer of thermal superconducting medium is made of graphene, copper foil, or aluminum foil, etc., and graphene, copper foil, and aluminum foil are electrically conductive, a short circuit might occur when the layer of thermal superconducting medium is connected to a power component in the optical module. For this reason, it is necessary to add the electrical insulating layer to the layer of thermal superconducting medium to transfer heat from the power component to the layer of thermal superconducting medium while preventing short circuit.

Thermal resistance is a parameter related to thickness and thermal conductivity. The value of thermal resistance can be calculated using the formula $R=L/(k*A)$, where L is the thickness of the thermal conducting material, A is the cross-sectional area perpendicular to the path of heat flow, and k is the thermal conductivity of the thermal conducting material. It is evident that, given the same thermal conducting material, less thickness will result in lower thermal resistance, and lower thermal resistance can increase the heat dissipation efficiency between the layer of thermal superconducting medium and the optical module. The thermal resistance of the insulating layers in the present embodiment is less than or equal to 0.15° C./W and less than the thermal resistance of the thermal conducting pads used with a typical optical module (approximately 0.35° C./W). In addition, the insulating layer can be made of compressible materials, and the thickness of the layer of compressible material can be less than or equal to 0.03 mm.

In one embodiment, the insulating layers 12 on the two sides of the first thermal conducting part 111 and the second thermal conducting part 112 are silica gel layers. The silica gel layers themselves have electrical insulating properties, and the thickness of these layers is controlled such that it is less than or equal to 0.03 mm, thereby ensuring that the silica gel layers have low thermal resistance.

Figure 3:
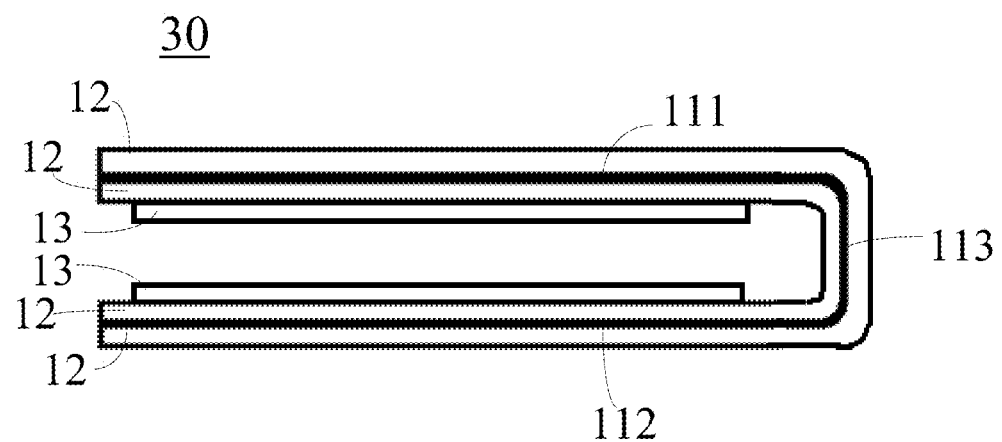
FIG. 3 is a schematic diagram showing a heat dissipating structure according to a third embodiment of the present application.

FIG. 3 is a schematic diagram showing a heat dissipating structure 30 according to a third embodiment of the present application. Similar to the heat dissipating structure 20 of the second embodiment, the heat dissipating structure 30 includes a layer of thermal superconducting medium. The layer of thermal superconducting medium includes the first thermal conducting part 111 and the second thermal conducting part 112 arranged opposite one another, and the third thermal conducting part 113 connecting the first thermal conducting part 111 and the second thermal conducting part 112. Unlike the heat dissipating structure 20 of the second embodiment, in the heat dissipating structure 30 of the third embodiment, multiple insulating layers are arranged on at least one side of the first thermal conducting part 111, the second thermal conducting part 112, and the third thermal conducting part 113 to achieve the functions of electrical insulation, heat transfer, and so forth.

As shown in FIG. 3, the first insulating layer 12 is arranged on each of the two sides of the first thermal conducting part 111, the second thermal conducting part 112, and the third thermal conducting part 113. Second insulating layers 13 are arranged on a lower surface of the first insulating layer 12 below the first thermal conducting part 111 and on an upper surface of the first insulating layer 12 above the second thermal conducting part 112, respectively. The first insulating layers 12 and the second insulating layers 13 can achieve the functions of thermal conduction and electrical insulation.

Figure 4:
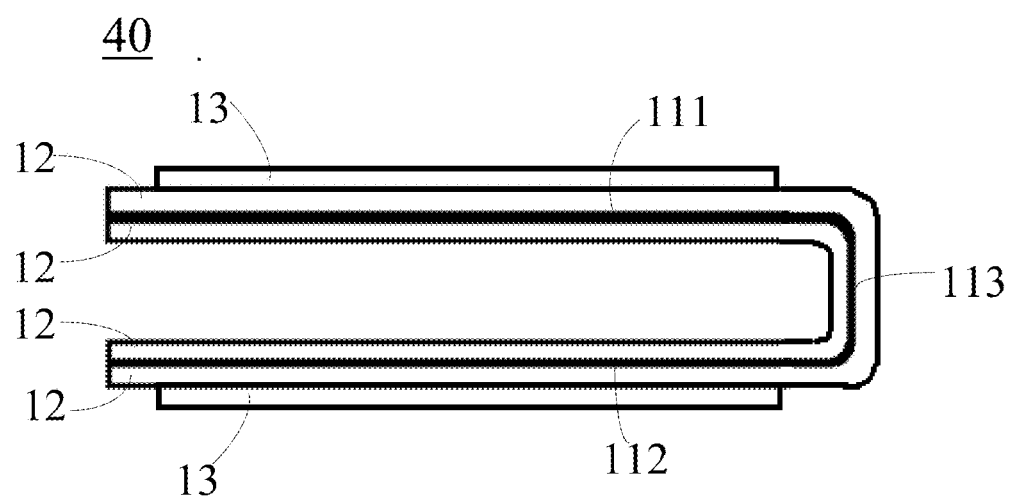
FIG. 4 is a schematic diagram showing another heat dissipating structure according to the third embodiment of the present application.

FIG. 4 is a schematic diagram showing a heat dissipating structure 40 according to the third embodiment of the present application. As shown in FIG. 4, the first insulating layer 12 is arranged on each of the two sides of the first thermal conducting part 111, the second thermal conducting part 112, and the third thermal conducting part 113. Second insulating layers 13 are arranged on an upper surface of the first insulating layer 12 above the first thermal conducting part 111 and on a lower surface of the first insulating layer 12 below the second thermal conducting part 112, respectively. The first insulating layers 12 and the second insulating layers 13 can achieve the functions of transfer of heat and insulation. The first insulating layers 12 and the second insulating layers 13 are similar to the insulating layers 12 provided by the second embodiment. No further description will be provided here. It should be understood that the second insulating layers 13 in the present embodiment cover portions of the first insulating layers 12. In other embodiments, the second insulating layers 13 may also cover the first insulating layers 12 in their entirety. No further examples will be described in detailed.

Figure 5:
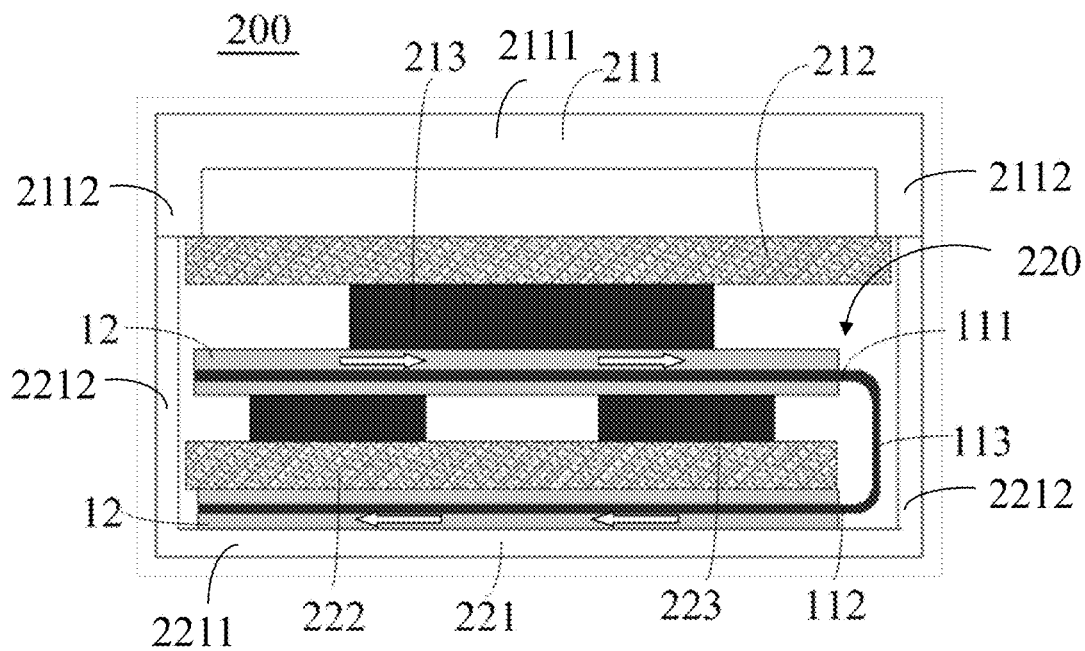
FIG. 5 is a schematic diagram showing an optical module in the fourth embodiment of the present application.

FIG. 5 is a schematic diagram showing an optical module 200 according to a fourth embodiment of the present application. The optical module 200 includes a first casing 211 and a second casing 221, and a first PCBA (Printed Circuit Board Assembly) board 212 and a second PCBA (Printed Circuit Board Assembly) board 222 located between the first casing 211 and the second casing 221. A first power component 213 and a plurality of second power components 223 are arranged on opposing surfaces of the first PCBA board 212 and the second PCBA board 222, respectively. The first casing 211 and the second casing 221 are pressed tightly against the first PCBA board 212 and the second PCBA board 222.

Further, the optical module 200 also includes a heat dissipating structure 220. The heat dissipating structure 220 is similar to the heat dissipating structure 20 of the second embodiment. The heat dissipating structure 220 includes: the first thermal conducting part 111 and the second thermal conducting part 112 arranged opposite to each other, and a third thermal conducting part 113 connecting the first thermal conducting part 111 and the second thermal conducting part 112. Heat is transferred between the first thermal conducting part 111, the third thermal conducting part 113, and the second thermal conducting part 112.

In the present embodiment, the first thermal conducting part 111 is thermally connected to the first power component 213 and the second power components 223. The second thermal conducting part 112 is thermally connected to the second casing 221. Heat generated by the first power component 213 and the second power components 223 during operation is transferred to the first thermal conducting part 111, and then transferred to the second thermal conducting part 112 by means of the third thermal conducting part 113. The heat is finally transferred out of the optical module 200 through the second casing 221.

Specifically, insulating layers 12 are arranged on two sides of the first thermal conducting part 111. The upper and lower sides of the first thermal conducting part 111 are thermally connected to the first power component 213 and the second power components 223, respectively. Accordingly, heat from the first power component 213 and the second power components 223 can be transferred to the first thermal conducting part 111 through the insulating layer 12. Due to the low thermal resistance of the insulating layers 12, the heat transfer efficiency associated with the first power component 213 and the second power components 223 can be increased. In addition, the electrical insulating property of the insulating layers 12 can prevent the occurrence of short circuits between the first power component 213 and the second power components 223.

The layer of thermal superconducting medium demonstrates good planar heat diffusion property. When heat is transferred to the first thermal conducting part 111, the planar heat diffusion property of the thermal superconducting material allows the heat to be transferred to the second thermal conducting part 112 by means of the third thermal conducting part 113.

Insulating layers 12 are also arranged on two sides of the second thermal conducting part 112. The insulating layer 12 below the second thermal conducting part 112 is thermally connected to the second casing 221. As a result, heat from the second thermal conducting part 112 can be transferred out of the optical module 200 through the second casing 221. In addition, the insulating layer 12 above the second thermal conducting part 112 is thermally connected to the second PCBA board 222. As a result, heat from the second PCBA board 222 can be transferred further through the insulating layer 12 and the second thermal conducting part 112 and out of the optical module 200 through the second casing 221, thereby further increasing the heat dissipation efficiency of the optical module 200.

Figure 6:
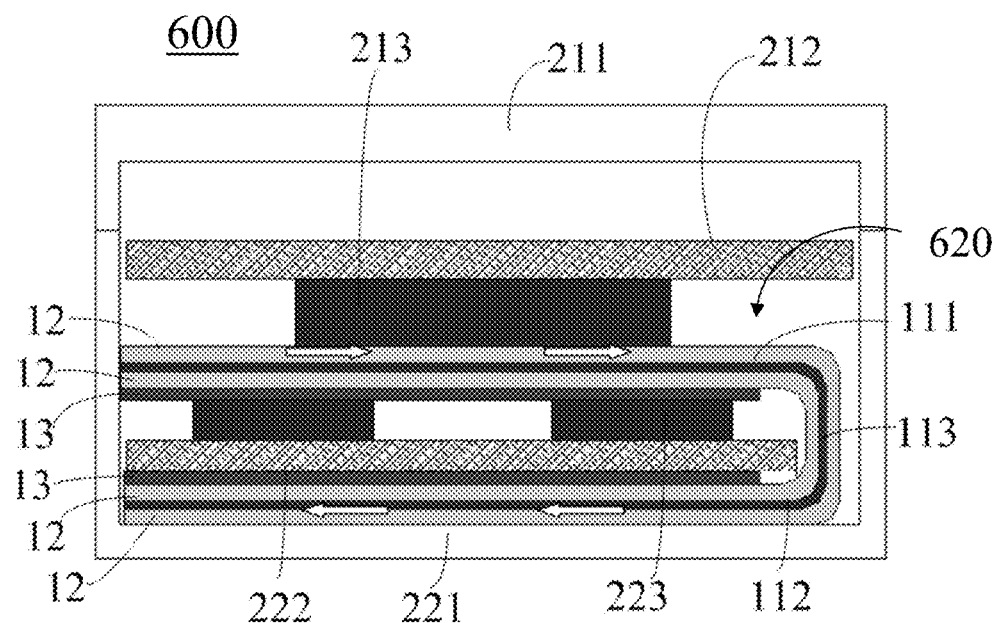
FIG. 6 is a schematic diagram showing an optical module in the fifth embodiment of the present application.

FIG. 6 is a schematic diagram showing an optical module 600 according to a fifth embodiment of the present application. The optical module 600 includes the first casing 211 and the second casing 221, and the first PCBA board 212 and the second PCBA board 222 located between the first casing 211 and the second casing 221. The first power component 213 and plurality of second power components 223 are arranged on opposing surfaces of the first PCBA board 212 and the second PCBA board 222, respectively. The first casing 211 and the second casing 221 are pressed tightly against the first PCBA board 212 and the second PCBA board 222.

Further, the optical module 600 also includes a heat dissipating structure 620, which is similar to the heat dissipating structure 30 provided by the third embodiment. The heat dissipating structure 620 includes the first thermal conducting part 111 and the second thermal conducting part 112 arranged opposite to each other, and the third thermal conducting part 113 connecting the first thermal conducting part 111 and the second thermal conducting part 112. Heat is transferred between the first thermal conducting part 111, the third thermal conducting part 113, and the second thermal conducting part 112.

In the present embodiment, the first thermal conducting part 111 is thermally connected to the first power component 213 and the second power components 223, and the second thermal conducting part 112 is thermally connected to the second casing 221. Heat generated by the first power component 213 and the second power components 223 during operation is transferred to the first thermal conducting part 111, and then transferred to the second thermal conducting part 112 by means of the third thermal conducting part 113. The heat is finally transferred out of the optical module 600 through the second casing 221.

Specifically, the first insulating layer 12 is arranged on each of the two sides of the first thermal conducting part 111, and the second insulating layer 13 is arranged on a lower surface of the first insulating layer 12 below the first thermal conducting part 111. The upper side of the first thermal conducting part 111 is thermally connected to the first power component 213 through the first insulating layer 12. The lower side of the first thermal conducting part 111 is thermally connected to the second power components 223 through the first insulating layer 12 and the second insulating layer 13. As a result, heat from the first power component 213 and the second power components 223 can be transferred to the first thermal conducting part 111 through the insulating layers 12 and 13. Due to the low thermal resistance of the insulating layers 12 and 13, the heat transfer efficiency associated with the first power component 213 and the second power components 223 can be increased. In addition, the electrical insulating property of the insulating layers 12 and 13 can prevent the occurrence of short circuits between the first power component 213 and the second power components 223.

The layer of thermal superconducting medium demonstrates good planar heat diffusion property. When heat is transferred to the first thermal conducting part 111, the planar heat diffusion property of the thermal superconducting material allows the heat to be transferred to the second thermal conducting part 112 by means of the third thermal conducting part 113.

First insulating layers 12 are also arranged on two sides of the second thermal conducting part 112. The second insulating layer 13 is arranged on an upper surface of the first insulating layer 12 above the second thermal conducting part 112. The first insulating layer 12 below the second thermal conducting part 112 is thermally connected to the second casing 221. As a result, heat from the second thermal conducting part 112 can be transferred out of the optical module 600 through the second casing 221. In addition, the first insulating layer 12 is thermally connected to the second insulating layer 13 above the second thermal conducting part 112 and the second PCBA board 222. As a result, the heat from the second PCBA board 222 can be transferred further through the insulating layers 12 and 13 and the second thermal conducting part 112 and out of the optical module 600 through the second casing 221, thereby further increasing the heat dissipation efficiency of the optical module.

Figure 7:
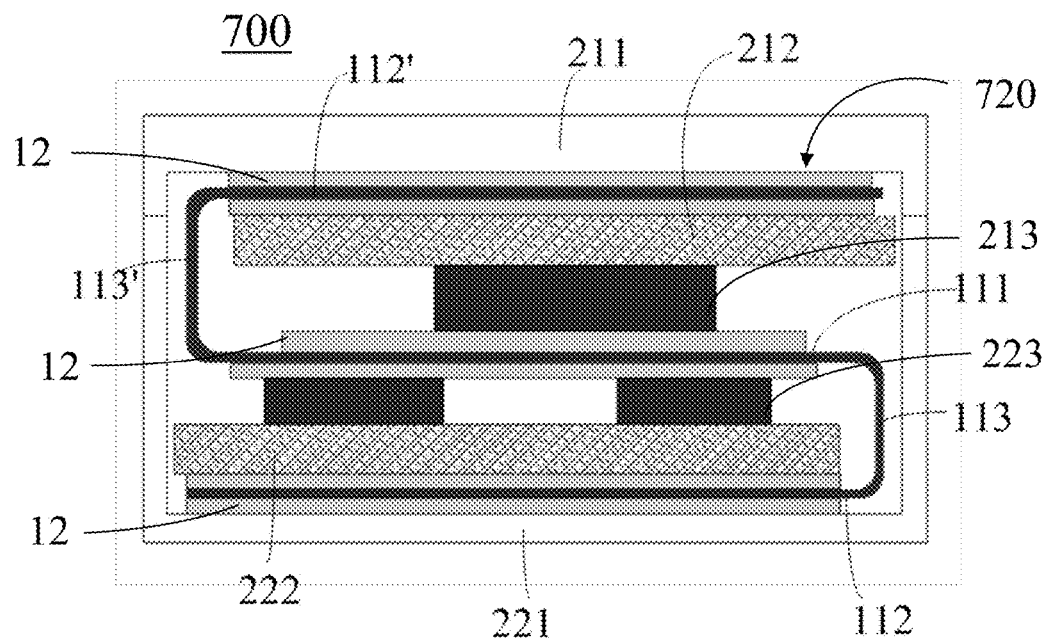
FIG. 7 is a schematic diagram showing an optical module in the sixth embodiment of the present application.

FIG. 7 is a schematic diagram showing an optical module 700 according to a sixth embodiment in the present application. The optical module 700 in the present embodiment is similar to that in the fourth embodiment and includes a dual layer PCBA structure, but a heat dissipating structure 720 of the optical module 700 is different from that in the fourth embodiment. The heat dissipating structure 720 in the present embodiment includes the first thermal conducting part 111, two second thermal conducting parts 112 and 112', and two third thermal conducting parts 113 and 113'. The second thermal conducting part 112 is thermally connected to the first thermal conducting part 111 through the third thermal conducting part 113, and the second thermal conducting part 112' is thermally connected to the first thermal conducting part 111 through the third thermal conducting part 113'.

Specifically, a cross section of the layer of thermal superconducting medium in the present embodiment exhibits an overall "S" shape. The structures of the first thermal conducting part 111, the second thermal conducting part 112, and the third thermal conducting part 113 are completely identical to those in the fourth embodiment. No further description will be provided here. The first thermal conducting part 111 is thermally connected to the second thermal conducting part 112' through the third thermal conducting part 113'. Insulating layers 12 are likewise arranged on two sides of the second thermal conducting part 112'. The insulating layer 12 above the second thermal conducting part 112' is thermally connected to the first casing 211, and the insulating layer 12 below the second thermal conducting part 112' is thermally connected to the first PCBA board 212.

Compared to the fourth embodiment, the present embodiment allows heat from the first power component 213 and the second power components 223 to be transferred from the first thermal conducting part 111 to the second thermal conducting parts 112 and 112' by means of the third thermal conducting parts 113 and 113', respectively. The heat is finally transferred out of the optical module 700 through the first casing 211 and the second casing 221. In addition, heat from the first PCBA board 212 can also be transferred out of the optical module 700 through the first casing 211 by means of the second thermal conducting part 112', which can further increase the heat dissipation efficiency of the optical module 700.

Figure 8:
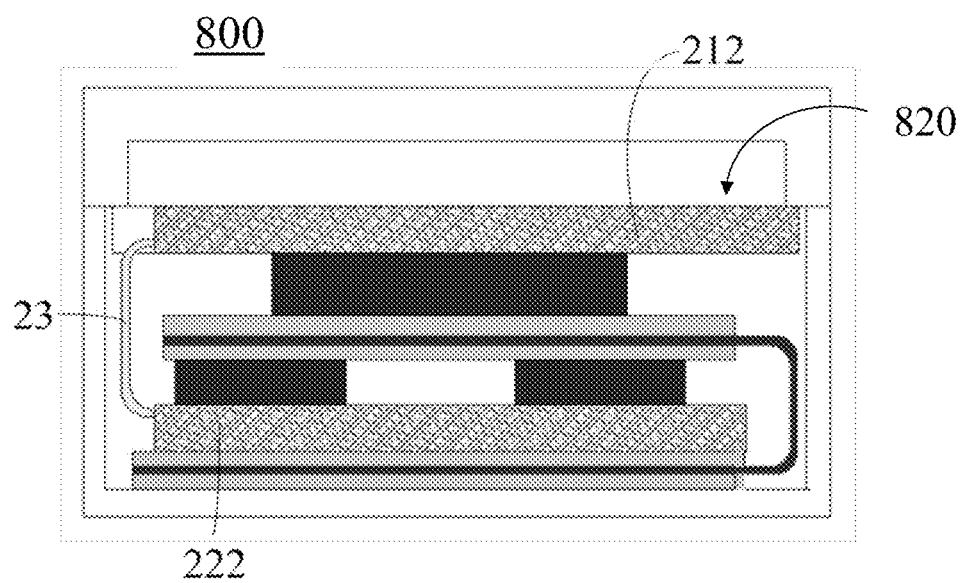
FIG. 8 is a schematic diagram showing an optical module in the seventh embodiment of the present application.

FIG. 8 is a schematic diagram showing an optical module 800 provided by a seventh embodiment of the present application. The difference between the optical module 800 in the present embodiment and the optical module 200 in the fourth embodiment is that the first PCBA board 212 is electrically connected to the second PCBA board 222 through a flexible circuit board 23. A heat dissipating structure 820 is the same as to the heat dissipating structure 220 in the fourth embodiment (FIG. 5). No further description will be provided here.

Further, in other embodiments, the first PCBA board may also be electrically connected to the second PCBA board by means of a pin. The heat dissipating structure is the same as that in the present embodiment.

In the optical modules provided by the fourth to the seventh embodiments, the first casing 211 and the second casing 221 are both arranged in a "H" shape, which is a rectangular shape without a side. With reference to FIG. 5, the first casing 211 includes a first horizontal wall 2111 arranged opposite to the first PCBA board and first side walls 2112 arranged perpendicular to the first PCBA board 212. The second casing 221 includes a second horizontal wall 2211 arranged opposite to the second PCBA board 222 and second side walls 2212 arranged perpendicular to the second PCBA board 222. Heat is transferred from the layer of thermal superconducting medium through the insulating layers 12 to the first horizontal wall 2111 and/or the second horizontal wall 2211 where it is dissipated. In other embodiments, the first side walls 2112 and/or the second side walls 2212 can be thermally connected to the layer of thermal superconducting medium located at the side of the first side walls 2112 and/or the second side walls 2212, which allows the first side wall 2112 and/or the second side wall 2212 to transfer heat, thus further increasing the heat dissipation efficiency of the optical module 200.

Further, in other embodiments, heat can also be transferred simultaneously using both horizontal walls and side walls. Heat can be transferred through multiple combinations of the first horizontal wall 2111 and the first side walls 2112 of the first casing 211 and the second horizontal wall 2211 and the second side walls 2212 of the second casing 221, thereby improving the heat dissipation of the optical module. No further examples will be detailed here.

The present application offers the following advantageous effects through the embodiments mentioned above.

Heat in an optical module with a dual layer PCBA structure is dissipated by means of a bent layer of thermal superconducting medium, which provides a heat dissipating structure with high heat dissipation efficiency.

Insulating layers on the heat dissipating structure can ensure that the layer of thermal superconducting medium is effectively in contact with the power components and the casings of the optical module, thus further improving heat dissipation.

The optical module can dissipate heat effectively, which reduces the power consumption of the optical module, increases its stability, and prevents the optical module from failure due to poor heat dissipation.

It should be understood that despite the descriptions of embodiments in the specification, there is not only one independent technical solution for each embodiment. The specification is written this way simply for the sake of clarity. Those skilled in the art should consider the specification as a whole; the technical solutions associated with the embodiments may be combined in appropriate ways to form other embodiments that can be understood by those skilled in the art.

The series of detailed descriptions above is only intended to provide specific descriptions of feasible embodiments of the present application. The detailed descriptions are not to be construed as limiting the scope of protection for the present application; all equivalent embodiments or changes that are not detached from the techniques of the present application in essence should fall under the scope of protection of the present application.

What is claimed is:

1. An optical module with a dual layer printed circuit board assembly (PCBA) structure, comprising:
    a first casing and a second casing;
    a first PCBA board and a second PCBA board located between the first casing and the second casing;
    a plurality of power components arranged on opposing surfaces of at least one of the first PCBA board and second PCBA board;
    a layer of thermal superconducting medium of a bent arrangement including a first thermal conducting part and a second thermal conducting part arranged opposite to each other, the first thermal conducting part being thermally connected to the power components, and the second thermal conducting part being thermally connected to at least one of the first casing and the second casing; and
    at least one insulating layer arranged between the layer of thermal superconducting medium and the power components.

2. The optical module according to claim 1, wherein
    the first casing comprises a first horizontal wall arranged opposite to the first PCBA board,
    the second casing comprises a second horizontal wall arranged opposite to the second PCBA board, and
    the layer of thermal superconducting medium is thermally connected to at least one of the first horizontal wall and the second horizontal wall.

3. The optical module according to claim 2, wherein the layer of thermal superconducting medium comprises a third thermal conducting part connecting the first thermal conducting part and the second thermal conducting part,
    the power components being thermally connected to the first thermal conducting part through the at least one insulating layer, and
    the second thermal conducting part being thermally connected to at least one of the first horizontal wall of the first casing or the second horizontal wall of the second casing.

4. The optical module according to claim 1, wherein
    the first casing comprises a first side wall arranged perpendicular to the first PCBA board,
    the second casing comprises a second side wall arranged perpendicular to the second PCBA board, and
    the layer of thermal superconducting medium is thermally connected to at least one of the first side wall or the second side wall.

5. The optical module according to claim 4, wherein the layer of thermal superconducting medium comprises a third thermal conducting part connecting the first thermal conducting part and the second thermal conducting part,
    the power components being thermally connected to the first thermal conducting part through the at least one insulating layer, and
    the second thermal conducting part being thermally connected to at least one of the first side wall of the first casing or the second side wall of the second casing.

6. The optical module according to claim 1, wherein an insulating layer is arranged on a surface of at least one side of at least one of the layer of thermal superconducting medium between the first casing and the first PCBA board or the layer of thermal superconducting medium between the second casing and the second PCBA board.

7. The optical module according to claim 1, wherein the layer of thermal superconducting medium has a planar thermal conductivity coefficient of 400-2000 W/(m·K) and a vertical thermal conductivity coefficient of 10-20 W/(m·K).

8. The optical module according to claim 7, wherein the layer of thermal superconducting medium is made of one of the following: graphene, copper foil, or aluminum foil.

9. The optical module according to claim 1, wherein the first casing and second casing are pressed tightly against the first PCBA board and second PCBA board.

10. The optical module according to claim 1, wherein the first PCBA board and the second PCBA board are electrically connected through a flexible circuit board.

11. The optical module according to claim 1, wherein heat generated by the power components is transferred through the insulating layer to the layer of thermal superconducting medium where the heat is diffused horizontally and transferred to at least one of the first casing and the second casing.

* * * * *